US012713971B1

(12) United States Patent
Davidson

(10) Patent No.: US 12,713,971 B1
(45) Date of Patent: Aug. 18, 2026

(54) CORROSIVE GAS SCAVENGING COMPONENT FOR A POWER SEMICONDUCTOR COMPONENT

(71) Applicant: Meta Platforms, Inc., Menlo Park, CA (US)

(72) Inventor: Howard Lee Davidson, San Mateo, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 550 days.

(21) Appl. No.: 18/081,663

(22) Filed: Dec. 14, 2022

(51) Int. Cl.

| | |
|---|---|
| ***H10W 76/48*** | (2026.01) |
| ***H10W 72/00*** | (2026.01) |
| ***H10W 72/50*** | (2026.01) |
| ***H10W 74/01*** | (2026.01) |
| ***H10W 90/00*** | (2026.01) |

(52) U.S. Cl.
CPC ........... *H10W 76/48* (2026.01); *H10W 74/01* (2026.01); *H10W 90/00* (2026.01); *H10W 72/5522* (2026.01); *H10W 72/5524* (2026.01); *H10W 72/884* (2026.01); *H10W 90/734* (2026.01); *H10W 90/753* (2026.01)

(58) Field of Classification Search
CPC ......... H01L 23/26; H01L 21/56; H01L 25/18; H01L 24/32; H01L 24/45; H01L 24/48; H01L 24/73; H01L 2224/32225; H01L 2224/45124; H01L 2224/45144; H01L 2224/48091; H01L 2224/48137; H01L 2224/73265
See application file for complete search history.

(56) References Cited

U.S. PATENT DOCUMENTS

2021/0305109 A1* 9/2021 Uhlig .................... H10W 42/00

* cited by examiner

*Primary Examiner* — Jay C Kim
*Assistant Examiner* — Woo K Lee
(74) *Attorney, Agent, or Firm* — EVERSHEDS SUTHERLAND (US) LLP

(57) ABSTRACT

An improved power module is disclosed. The power module comprises a power semiconductor component. The power module comprises an encasing configured to at least in part encase the power semiconductor component. The power module comprises a corrosive gas scavenging component placed within the encasing and configured to reduce corrosion of metal included in the power semiconductor component by having a material reactive to one or more corrosive gases to consume at least a portion of the one or more corrosive gases within the encasing.

19 Claims, 4 Drawing Sheets

302
302C
302B
310
302A
316
308
306
312
309
304
300
314
303

CORROSIVE GAS SCAVENGING COMPONENT FOR A POWER SEMICONDUCTOR COMPONENT

BACKGROUND OF THE DISCLOSURE

High temperature and high electric fields are some of the most crucial factors affecting the reliability of certain electronic devices. For example, high temperature or high electric field stress may affect the reliability of many power devices, including insulated-gate bipolar transistor (IGBT) modules, power metal-oxide-semiconductor field-effect transistor (power MOSFET) modules, gallium nitride (GaN) field-effect transistor (FET) modules, and the like.

An IGBT power module functions as a switch and may be used to switch electrical power on and off at a high speed and with high energy efficiency. The IGBT power module may be used for high power applications due to its ability to enhance switching, temperature, weight, and cost performance.

A power MOSFET is a specific type of MOSFET designed to handle significant power levels. Compared to the other power semiconductor devices, such as an IGBT or a thyristor, its main advantages are high switching speed and good efficiency at low voltages.

Gallium nitride (GaN) FETs switch much faster than silicon MOSFETs, offering the potential to achieve lower-switching losses. GaN FETs may be used in a wide range of applications, including telecommunications, servers, motor drives, laptop adapters, and on-board chargers for electric vehicles.

BRIEF DESCRIPTION OF THE DRAWINGS

Various embodiments of the disclosure are disclosed in the following detailed description and the accompanying drawings.

DETAILED DESCRIPTION

Figure 1:
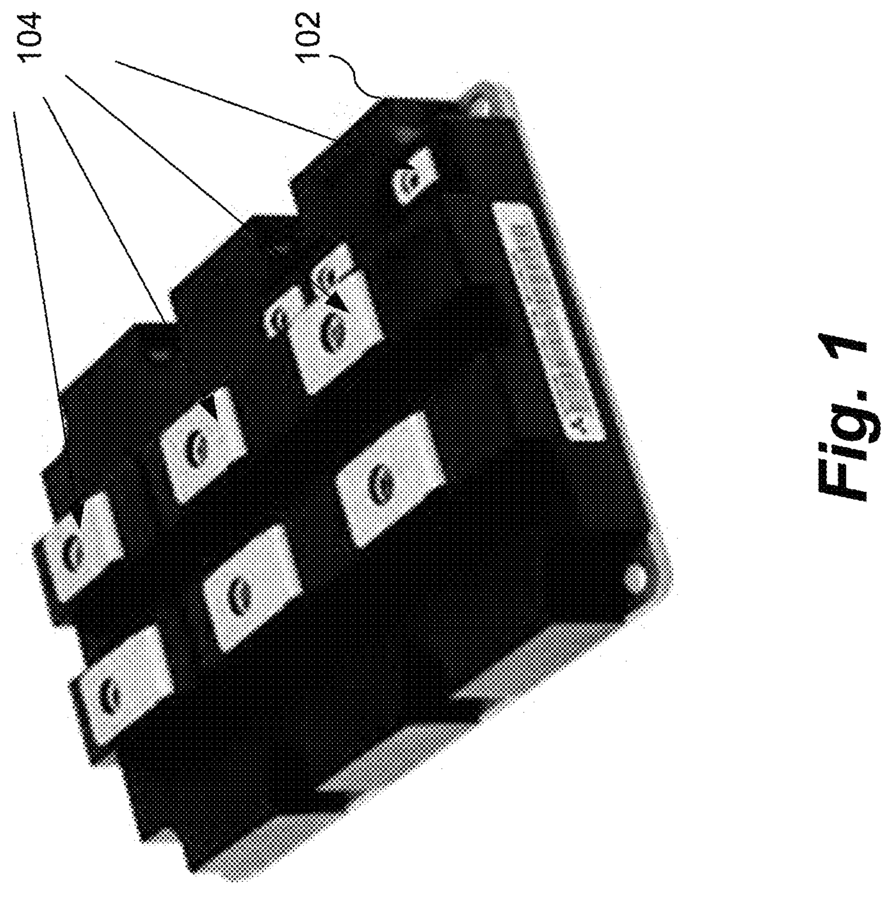
FIG. 1 illustrates an isometric view of a power module 100.

The disclosure can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the disclosure may take, may be referred to as techniques. In general, the order of the steps of disclosed processes may be altered within the scope of the disclosure. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the disclosure is provided below along with accompanying figures that illustrate the principles of the disclosure. The disclosure is described in connection with such embodiments, but the disclosure is not limited to any embodiment. The scope of the disclosure is limited only by the claims and the disclosure encompasses numerous alternatives, modifications and equivalents. Numerous specific details are set forth in the following description in order to provide a thorough understanding of the disclosure. These details are provided for the purpose of example and the disclosure may be practiced according to the claims without some or all of these specific details. For the purpose of clarity, technical material that is known in the technical fields related to the disclosure has not been described in detail so that the disclosure is not unnecessarily obscured.

Data center operation requires substantial amounts of power that is delivered efficiently and reliably. Data centers require equipment that can provide data center services without failure or interruption. For example, high-efficiency Uninterruptible Power Supply (UPS) Systems are used to provide continuous power to data centers in order to protect information for financial institutions, companies, and organizations.

A UPS is a battery backup that supplies power to a system in order to provide enough time to properly power down the equipment when there is a failure in utility power. A UPS unit alone will only keep the units powered for a limited amount of time, usually less than 30 minutes, but can be used in conjunction with a facility generator to ensure that the system continues to run even in extended power outages. UPS systems are a critical component of data center backup power. Without them, power fluctuations and outages may take down workloads and damage hardware.

One common problem faced by UPS systems deployed at data centers is that the power modules of the UPS systems often have high failure rates. One of the main causes of the high failure rates of the power modules of the UPS systems is corrosion. Corrosion is a natural process that converts a refined metal into a more chemically stable compound, such as an oxide. It is the gradual deterioration of materials by chemical or electrochemical reaction with their environment. Therefore, improved techniques to improve the reliability of the power modules of the UPS systems would be desirable.

In the present application, an improved power module is disclosed. The power module comprises a power semiconductor component. The power module comprises an encasing configured to at least in part encase the power semiconductor component. The power module comprises a corrosive gas scavenging component placed within the encasing and configured to reduce corrosion of metal included in the power semiconductor component by having a material reactive to one or more corrosive gases to consume at least a portion of the one or more corrosive gases within the encasing.

In the present application, an improved power module is disclosed. The power module comprises a power semiconductor component. The power module comprises an encasing configured to at least in part encase the power semiconductor component. The power module comprises a corrosive gas scavenging component placed within the encasing and configured to reduce corrosion of metal included in the power semiconductor component by having a material that absorbs one or more corrosive gases to consume at least a portion of the one or more corrosive gases within the encasing.

In the present application, a method of forming an improved power module is disclosed. The method comprises providing a power semiconductor component. The method comprises encasing the power semiconductor component with an encasing. The method further comprises placing a corrosive gas scavenging component within the encasing to reduce corrosion of metal included in the power semiconductor component by having a material reactive to one or more corrosive gases to consume at least a portion of the one or more corrosive gases within the encasing.

In the present application, a method of forming an improved power module is disclosed. The method comprises providing a power semiconductor component. The method comprises encasing the power semiconductor component with an encasing. The method further comprises placing a corrosive gas scavenging component within the encasing to reduce corrosion of metal included in the power semiconductor component by having a material that absorbs one or more corrosive gases to consume at least a portion of the one or more corrosive gases within the encasing.

FIG. 1 illustrates an isometric view of a power module 100. Power module 100 may be an insulated-gate bipolar transistor (IGBT) power module, a power metal-oxide-semiconductor field-effect transistor (power MOSFET) module, a silicon carbide MOSFET, a gallium nitride (GaN) field-effect transistor (FET) power module, and the like. Power module 100 includes an encasing 102. Encasing 102 includes a baseplate, a wall surrounding the baseplate, and a top cover. In some embodiments, the wall surrounding the baseplate and the top cover are formed using a plastic material. In some embodiments, the wall surrounding the baseplate and the top cover are integrated together as one piece to form a part of the encasing 102. Encasing 102 is configured to encase the power semiconductor components that are positioned above the baseplate. Above the top cover includes a plurality of power or control terminals 104.

Figure 2:
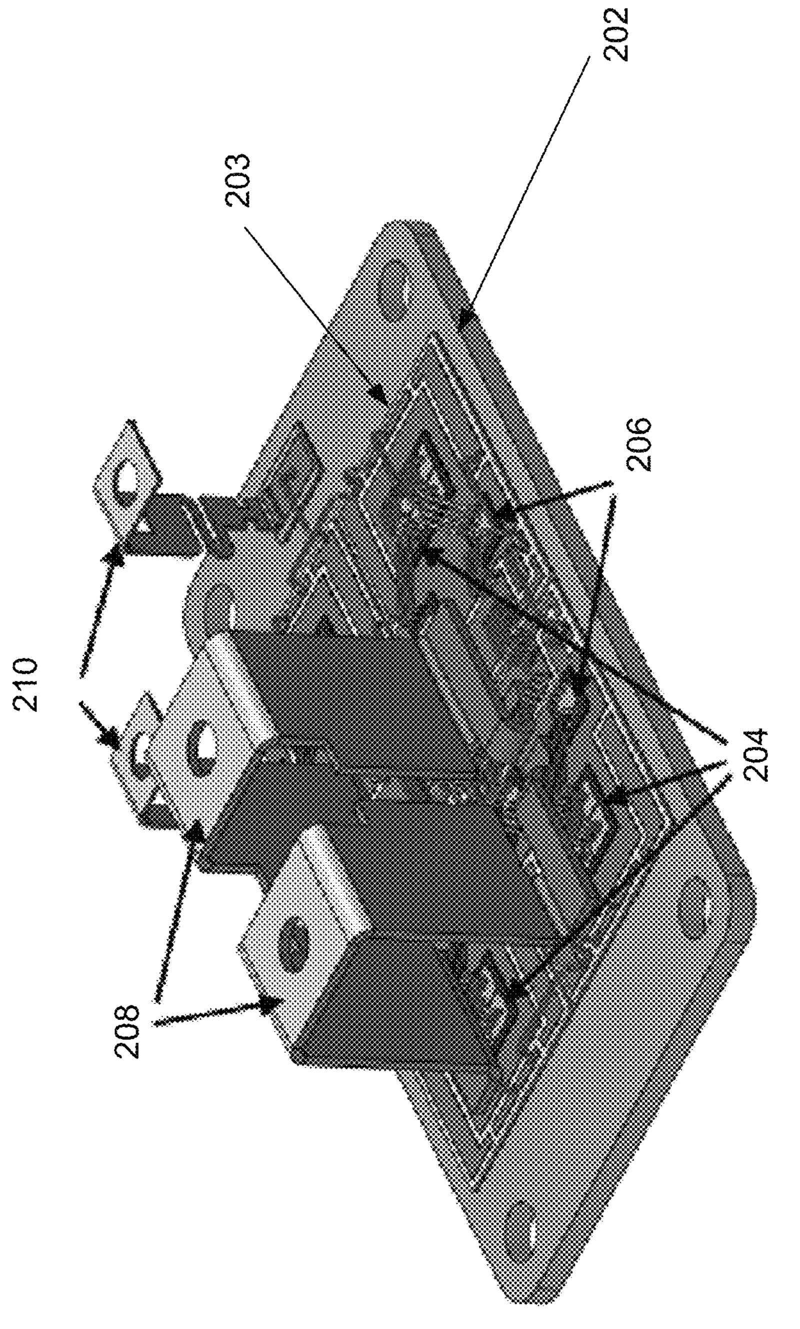
FIG. 2 illustrates an isometric view of a power module 200 with part of its encasing removed to show the interior of the power module.

FIG. 2 illustrates an isometric view of a power module 200 with part of its encasing removed to show the interior of the power module. Power module 200 may be an insulated-gate bipolar transistor (IGBT) power module, a power metal-oxide semiconductor field-effect transistor (power MOSFET) module, a gallium nitride (GaN) field-effect transistor (FET) power module, and the like.

The basic structure of the power module 200 includes a baseplate 202 that supports the various power semiconductor components of the power module, including power semiconductor chips (e.g., IGBT chips), freewheeling diodes, and the connections between the different components of the power module. In some embodiments, baseplate 202 includes a full metal layer on the bottom to contact a heat sink (not shown in FIG. 2). The base metal layer provides mechanical integrity to baseplate 202, and aids in heat distribution, as well as heat transfer to a heat sink, ambient air, or to the mounting surface. In some embodiments, above baseplate 202 additionally includes a ceramic core. In some embodiments, the ceramic core is a Direct Bond Copper (DBC) ceramic plate. Direct Bond Copper technology may be used to bond a copper foil directly to a ceramic substrate. The interface between the copper and the ceramic is very reliable. Above the ceramic core also includes a patterned copper layer 203 to provide part of the connections between the various chips and other components, and to the exterior of the power module. For example, copper layer 203 provides connections to a plurality of power semiconductor chips 204 (e.g., IGBT chips, power MOSFET chips, and GaN FET chips) and a plurality of diode chips 206. Copper layer 203 is also electrically connected to a plurality of power terminals 208 and a plurality of control terminals 210, which provide external connections to the power module.

The remaining connections of power module 200 may be made by wire bonds. Wire bonding is the process of creating electrical interconnections between semiconductors (or other integrated circuits) and silicon chips using bonding wires, which are fine wires made of metals, such as gold and aluminum.

Figure 3:
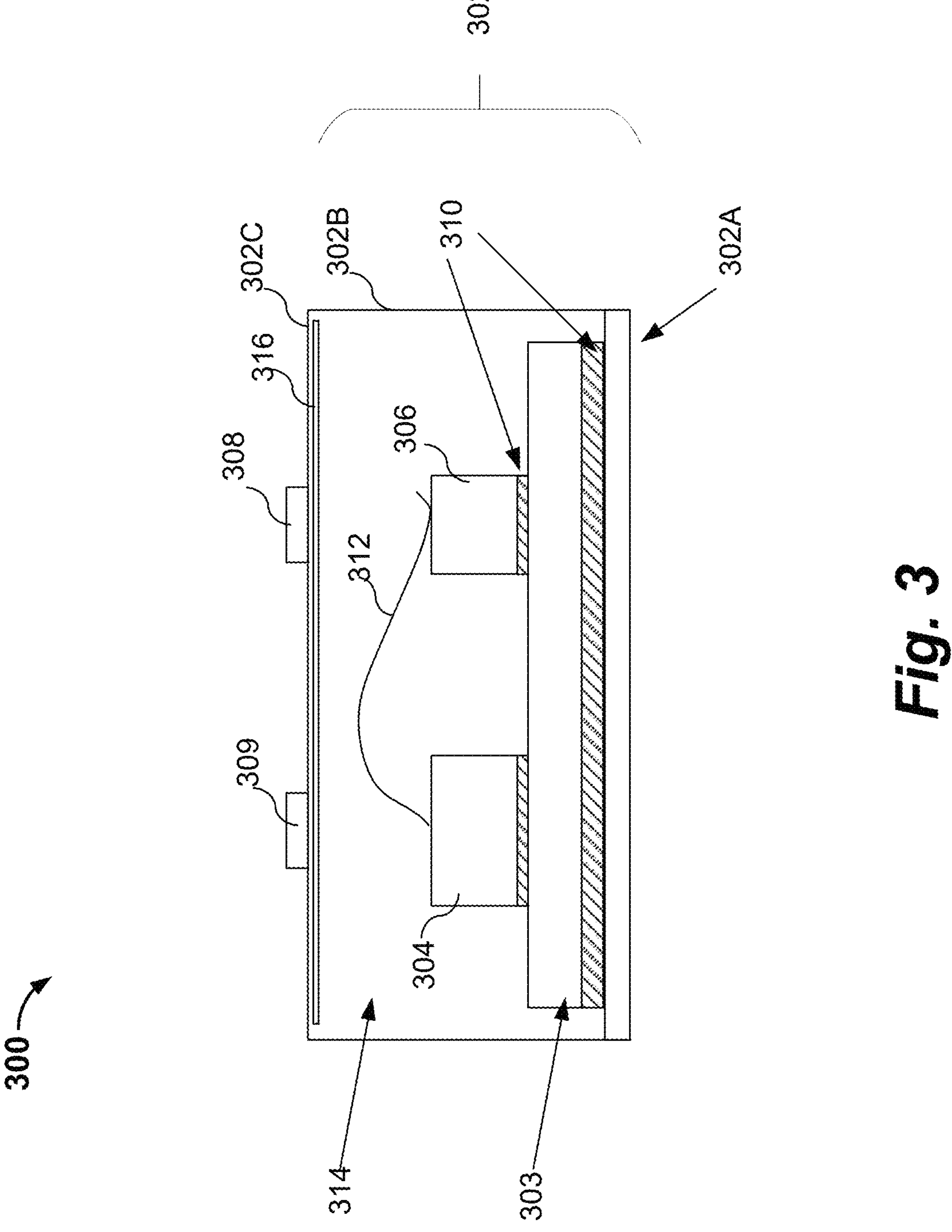
FIG. 3 illustrates a cross-sectional view of a power module 300.

FIG. 3 illustrates a cross-sectional view of a power module 300. Power module 300 comprises an encasing 302 configured to at least in part encase one or more power semiconductor components. Encasing 302 includes a baseplate 302A, a wall 302B surrounding baseplate 302A, and a top cover 302C. In some embodiments, the wall 302B surrounding baseplate 302A and top cover 302C are formed using a plastic material. In some embodiments, the wall 302B surrounding baseplate 302A and the top cover 302C are integrated together as one piece to form a part of the encasing 302. Encasing 302 encases the components that are positioned above baseplate 302A.

Baseplate 302A supports the various components of the power module, including power semiconductor chips (e.g., IGBT chips), freewheeling diodes, and the connections between the different components of the power module. In some embodiments, baseplate 302A includes a full metal layer on the bottom to contact a heat sink. The base metal layer provides mechanical integrity to baseplate 302A, and aids in heat distribution, as well as heat transfer to a heat sink, ambient air, or to the mounting surface. In some embodiments, above baseplate 302A includes a ceramic core. In some embodiments, the ceramic core is a Direct Bond Copper (DBC) ceramic plate 303. Direct Bond Copper technology may be used to bond a copper foil directly to a ceramic substrate. The interface between the copper and the ceramic is very reliable. DBC ceramic plate 303 includes a patterned copper layer to provide part of the connections between the various chips and other components, and to the exterior of the power module. For example, the copper layer provides connections to a plurality of power semiconductor chips 304 (e.g., IGBT chips, power MOSFET chips, and GaN FET chips) and a plurality of diode chips 306. Soldering layers 310 may also be used to provide electrical connections to different components. Power module 300 further includes a plurality of power terminals 308 and a plurality of control terminals 309, which provide external connections to the power module. Power module 300 also includes one or more wire bonds 312. Wire bonding is the process of creating electrical interconnections between semiconductors (or other integrated circuits) and silicon chips using bonding wires, which are fine wires made of metals, such as gold and aluminum.

In some embodiments, power module 300 is partially filled with an encapsulant 314. Encapsulant 314 is a material for encapsulating the components within the power module 300. Encapsulant 314 provides mechanical and environmental protection. For example, encapsulant 314 may be used to provide protection against flashover, which is the ignition of combustible material in an enclosed space. Examples of encapsulant 314 include silicone gel and epoxy resin.

The exposure of electronics to an environment where humidity, temperature, and atmospheric pollutants are not controlled may result in corrosion. Corrosion is a process through which refined metals are converted into more stable compounds, such as metal oxides, metal sulfides, or metal hydroxides. Atmospheric pollutants that may enter power module 300 include corrosive gases present in the ambient air. For example, the external connections to the power module 300 through the encasing 302 (e.g., the power terminals 308 and the control terminals 309) may not be fully sealed, which allows gas exchange between the ambient atmosphere and the inside of the power module. Even if the leads or terminals on the encasing 302 are sealed, corrosive gases may still enter the power module 300 due to the gases diffusing through the encasing, including through the top cover, the side wall, or the baseplate. Furthermore, the corrosive gases may also permeate through the encapsulant 314. As a result, over time, the corrosive gases present inside the power module 300 may cause corrosion to various parts or components of the power module 300, such as the guard rings around the outside of the power semiconductor chips 304 and the top surfaces of the chips. A guard ring is typically a copper trace that is drawn across a node in a circuit. The guard ring protects the node that it is surrounding from external disturbance. The copper on the guard rings may react with the corrosive gases and turn into another more stable copper compound. Power semiconductor chips 304 may also contain aluminum that may react with the corrosive gases and turn into another more stable aluminum compound.

Therefore, power module 300 further comprises one or more corrosive gas scavenging components placed within encasing 302 and configured to reduce corrosion of metal included in the power semiconductor components (e.g., power semiconductor chips 304 and diode chips 306) by having a material that is reactive to or can absorb one or more corrosive gases to consume at least a portion of the one or more corrosive gases within the encasing. For example, at least one corrosive gas scavenger 316 is placed inside power module 300 to remove any corrosive gasses that may diffuse through encasing 302, including through the top cover 302C, the side wall 302B, or the baseplate 302A, before they may damage the power semiconductor chips 304. The corrosive gas scavenger 316 may include a chemically active substance acting to make innocuous, absorb, capture, or remove the undesirable corrosive gases. In some embodiments, corrosive gas scavenger 316 as shown in FIG. 3 may be any container, holder, carrier, packet, bin, case, or cartridge for holding one or more types of material that may react with or absorb one or more types of corrosive gases.

Figure 4:
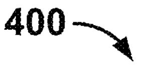
FIG. 4 illustrates an exemplary process 400 for forming an improved power module.
Figure 4:
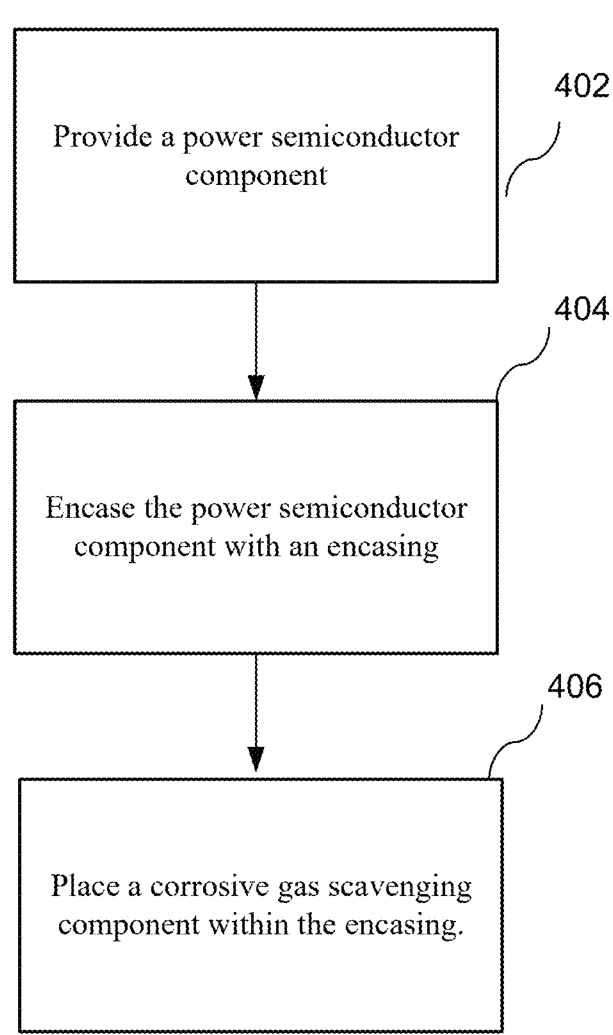

FIG. 4 illustrates an exemplary process 400 for forming an improved power module. At step 402, a power semiconductor component is provided. At step 404, the power semiconductor component is encased with an encasing. At step 406, a corrosive gas scavenging component is placed within the encasing. The corrosive gas scavenging component reduces corrosion of metal included in the power semiconductor component by having a material reactive to one or more corrosive gases to consume at least a portion of the one or more corrosive gases within the encasing.

Corrosive gases that may enter power module 300 and cause damages to the components include atmospheric gases that contain sulfur, including hydrogen sulfide (H2S), carbonyl sulfide (OCS), carbon disulfide (CS2), sulfur dioxide (SO2), and the like. H2S is a colorless chalcogen-hydride gas that is poisonous, corrosive, flammable, and having a characteristic foul odor of rotten eggs. Atmospheric gases that contain sulfur may cause sulfurization of copper that is present in the components of power module 300.

Corrosive gases that may enter power module 300 and cause damages to the components include gases that contain chlorine, including hydrogen chloride (HCl). At room temperature, hydrogen chloride is a colorless gas, which forms white fumes of hydrochloric acid upon contact with atmospheric water vapor. Airborne hydrogen chloride may cause copper contamination.

Another corrosive gas that may enter power module 300 and cause damages to its components include ammonia (NH3). Some data centers are located in rural areas that are close to farms, where anhydrous ammonia is typically used as a farm fertilizer. Some data centers are close to coal-fired power plants where ammonia is used as a fuel. Ammonia is a colorless, pungent gas composed of nitrogen and hydrogen. It is the simplest stable compound of these elements and serves as a starting material for the production of many commercially important nitrogen compounds. Ammonia, especially when mixed with water, may cause ammonia corrosion to many metals, including zinc, copper, and brass.

In some embodiments, the one or more types of material reactive to the one or more corrosive gases contained in corrosive gas scavenger 316 include silver. The silver contained in corrosive gas scavenger 316 may be in different forms, including shots, pieces, powder, nanoparticles, nanopowder, flakes, foils, wires, and tubes. For example, corrosive gas scavenger 316 may include fine-grained silver powder to maximize the surface area for reacting with the corrosive gases. Silver powder may be available in different grades. In some embodiments, corrosive gas scavenger 316 includes colloidal silver, which is a suspension of the element silver in a solution, such as water.

For example, silver may react with an atmospheric gas that contains sulfur, such as hydrogen sulfide (H2S), and turn into silver sulfide. Since silver sulfide is a dense black solid, it can be captured inside corrosive gas scavenger 316 that holds the silver. In another example, silver may react with an atmospheric gas that contains chlorine, such as hydrogen chloride (HCl), and turn into silver chloride. Since silver chloride is a white crystalline solid, it can also be captured inside corrosive gas scavenger 316 that holds the silver.

In some embodiments, the one or more types of material reactive to the one or more corrosive gases contained in corrosive gas scavenger 316 include copper. For example, corrosive gas scavenger 316 may include fine-grained copper powder to maximize the surface area for reacting with the corrosive gases. In some embodiments, corrosive gas scavenger 316 includes colloidal copper, which is a suspension of the element copper in a solution, such as water. For example, copper may react with an atmospheric gas that contains sulfur, such as hydrogen sulfide (H2S), and turn into copper sulfide. In some embodiments, the one or more types of material reactive to the one or more corrosive gases contained in corrosive gas scavenger 316 include other metals, such as aluminum and iron.

In some embodiments, corrosive gas scavenger 316 may include one or more types of material for removing some of the one or more corrosive gases. For example, activated carbon (also referred to as activated charcoal) can absorb the one or more corrosive gases. Activated carbon is a highly porous material that is effective in attracting and removing organic chemicals and gasses. For example, activated carbon may be used to absorb and remove hydrogen sulfide.

Corrosive gas scavenger 316 may be any container, holder, carrier, packet, bin, case, or cartridge for holding the one or more types of material that may react with or absorb the one or more types of corrosive gases. In some embodiments, corrosive gas scavenger 316 may be a carrier sheet that can hold or contain the one or more types of reactive or absorbing materials. The carrier sheet may be made of a non-woven polymer fabric, such as Tyvek. Tyvek is a brand of synthetic flashspun high-density polyethylene fibers. Tyvek's properties include being difficult to tear but easily cut. It is waterproof against liquids, but it allows vapor to pass through. The carrier sheet may also be made of Gore-Tex, a material that stops liquids but allows vapor to pass through. In some embodiments, the carrier sheet may be impregnated (e.g., soaked or saturated) with a fine-grained powder for reacting with or removing the targeted gasses. In some embodiments, to confine the fine-grained reactive or absorbing powder and the compound formed after the fine-grained powder has reacted with the corrosive gases or absorbed the corrosive gases, one or more cover sheets may be heat fused around the impregnated carrier sheet to make a protective envelope for covering the impregnated carrier sheet.

In some embodiments, corrosive gas scavenger 316 may be a sachet, i.e., a small bag or packet, that can hold or contain the one or more types of materials for reacting with or absorbing the corrosive gases. The sachet may be filled with a fine-grained powder for reacting with or removing the targeted gasses. The sachet may be made of a non-woven polymer fabric, such as Tyvek.

In some embodiments, corrosive gas scavenger 316 may be positioned on the bottom surface of the top cover 302C and above or adjacent to the encapsulant 314 inside encasing 320, such that corrosive gas scavenger 316 is not too close to the power or signal conductors. For example, the impregnated carrier sheet and the one or more cover sheets may be placed on the bottom surface of the top cover 302C and above the encapsulant 314. The combined thickness of the impregnated carrier sheet and the one or more cover sheets should be thin. The combined thickness should be less than a threshold thickness, such that the sheets are not too close to the power or signal conductors. Similarly, sachet 504 may be placed on the bottom surface of the top cover 302C and above the encapsulant 314.

In some embodiments, pressure-sensitive adhesive (PSA) may be used to attach the corrosive gas scavenger 316 to the bottom surface of the top cover 302C of encasing 302. PSA is a type of nonreactive adhesive which forms a bond when pressure is applied to bond the adhesive with a surface. No solvent, water, or heat is needed to activate the adhesive.

The reactive metal powder contained in corrosive gas scavenger 316 may be depleted and the absorbing powder may be saturated over time. Therefore, the mass or amount of the material for reacting with or absorbing the corrosive gases should be sufficient to last for the expected lifespan of the power module.

In some embodiments, the power terminals 308, the control terminals 309, or any leads on the top cover 302C may be sealed with a polymer sealant to reduce the amount of corrosive gases entering the power module 300. For example, epoxy, acrylic, and silicone compounds may be used for this purpose.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A device, comprising:

a power semiconductor component;

an encasing configured to at least in part encase the power semiconductor component, the encasing including a baseplate configured to support the power semiconductor component, walls surrounding the baseplate, and a top cover, wherein the walls are separable from the baseplate; and a corrosive gas scavenging component that is attached to an interior surface of the top cover, is encased by the encasing, and is configured to reduce corrosion of metal included in the power semiconductor component by having a material reactive to one or more corrosive gases to consume at least a portion of the one or more corrosive gases within the encasing, wherein the corrosive gas scavenging component includes a bag or sachet.

2. The device of claim 1, wherein the corrosive gas scavenging component comprises a holder holding the material reactive to the one or more corrosive gases.

3. The device of claim 1, wherein the corrosive gas scavenging component comprises a carrier sheet impregnated with the material reactive to the one or more corrosive gases.

4. The device of claim 3, wherein the carrier sheet is impregnated with a powder of the material reactive to the one or more corrosive gases.

5. The device of claim 3, wherein the corrosive gas scavenging component comprises a cover sheet covering the carrier sheet impregnated with the material reactive to the one or more corrosive gases.

6. The device of claim 1, wherein the corrosive gas scavenging component is made of a material that is waterproof against liquids but allows vapor to pass through.

7. The device of claim 1, wherein the corrosive gas scavenging component is positioned adjacent to an encapsulant inside the encasing.

8. The device of claim 1, wherein the material reactive to the one or more corrosive gases comprises at least one of the following: silver or copper.

9. The device of claim 1, wherein the material reactive to the one or more corrosive gases comprises a material reactive to one or more of the following: atmospheric gases containing sulfur, atmospheric gases containing chlorine, or ammonia.

10. A device, comprising:

a power semiconductor component;

an encasing configured to at least in part encase the power semiconductor component, the encasing including a baseplate configured to support the power semiconductor component, walls surrounding the baseplate, and a top cover, wherein the walls are separable from the baseplate; and a corrosive gas scavenging component that is attached to an interior surface of the top cover, is encased by the encasing, and is configured to reduce corrosion of metal included in the power semiconductor component by having a material that absorbs one or more corrosive gases to consume at least a portion of the one or more corrosive gases within the encasing, wherein the corrosive gas scavenging component includes a bag or sachet.

11. The device of claim 10, wherein the corrosive gas scavenging component comprises a holder holding the material that absorbs the one or more corrosive gases.

12. The device of claim 10, wherein the corrosive gas scavenging component comprises a carrier sheet impregnated with the material that absorbs the one or more corrosive gases.

13. The device of claim 12, wherein the carrier sheet is impregnated with a powder of the material that absorbs the one or more corrosive gases.

14. The device of claim 12, wherein the corrosive gas scavenging component comprises a cover sheet covering the carrier sheet impregnated with the material that absorbs the one or more corrosive gases.

15. The device of claim 10, wherein the material that absorbs the one or more corrosive gases comprises activated carbon.

16. A method, comprising:

providing a power semiconductor component;

encasing the power semiconductor component with an encasing, the encasing including a baseplate configured to support the power semiconductor component, walls surrounding the baseplate, and a top cover, wherein the walls are separable from the baseplate; and attaching a corrosive gas scavenging component to an interior surface of the top cover within the encasing to reduce corrosion of metal included in the power semiconductor component by having a material reactive to one or more corrosive gases to consume at least a portion of the one or more corrosive gases within the encasing, wherein the corrosive gas scavenging component is encased by the encasing, and wherein the corrosive gas scavenging component includes a bag or sachet.

17. The method of claim 16, wherein the corrosive gas scavenging component comprises a holder holding the material reactive to the one or more corrosive gases.

18. The method of claim 16, wherein the corrosive gas scavenging component comprises a carrier sheet impregnated with the material reactive to the one or more corrosive gases.

19. The method of claim 18, further comprising:

impregnating the carrier sheet with a powder of the material reactive to the one or more corrosive gases.

* * * * *